(12) United States Patent
Watanabe

(10) Patent No.: US 12,482,669 B2
(45) Date of Patent: Nov. 25, 2025

(54) SEMICONDUCTOR MANUFACTURING APPARATUS AND METHOD OF MANUFACTURING SEMICONDUCTOR DEVICE

(71) Applicant: Kioxia Corporation, Tokyo (JP)

(72) Inventor: Takashi Watanabe, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 524 days.

(21) Appl. No.: 17/897,127

(22) Filed: Aug. 27, 2022

(65) Prior Publication Data

US 2023/0290648 A1  Sep. 14, 2023

(30) Foreign Application Priority Data

Mar. 9, 2022 (JP) ................. 2022-036600

(51) Int. Cl.
*H01L 21/463* (2006.01)
*B24B 1/00* (2006.01)
*H01L 21/477* (2006.01)
*H01L 21/67* (2006.01)

(52) U.S. Cl.
CPC .............. *H01L 21/463* (2013.01); *B24B 1/00* (2013.01); *H01L 21/477* (2013.01); *H01L 21/67103* (2013.01); *H01L 21/67115* (2013.01)

(58) Field of Classification Search
CPC ................. H01L 21/463; H01L 21/477; H01L 21/67103; H01L 21/67115; B24B 1/00
See application file for complete search history.

(56) References Cited

U.S. PATENT DOCUMENTS

| 6,012,967 | A | * | 1/2000 | Satake | ................. B24B 57/02 451/6 |
| 6,616,801 | B1 | | 9/2003 | Boyd | |
| 6,746,319 | B2 | * | 6/2004 | Tada | ................. B24B 49/10 451/8 |
| 8,128,458 | B2 | * | 3/2012 | Saito | ................. B24B 49/12 451/6 |
| 2003/0032377 | A1 | | 2/2003 | Tada et al. | |
| 2003/0119427 | A1 | | 6/2003 | Misra | |
| 2019/0164730 | A1 | | 5/2019 | Peng et al. | |
| 2020/0001426 | A1 | | 1/2020 | Soundararajan et al. | |
| 2020/0001427 | A1 | | 1/2020 | Soundararajan et al. | |
| 2021/0114164 | A1 | | 4/2021 | Kabasawa et al. | |

FOREIGN PATENT DOCUMENTS

| CN | 110682209 A | 1/2020 |
| JP | H10156708 A | 6/1998 |
| JP | 2000094304 A | 4/2000 |

(Continued)

*Primary Examiner* — Jay C Kim
*Assistant Examiner* — Woo K Lee
(74) *Attorney, Agent, or Firm* — Holtz, Holtz & Volek PC

(57) ABSTRACT

A semiconductor manufacturing apparatus is a semiconductor manufacturing apparatus for holding a polishing object on a polishing head and polishing a surface of the polishing object. The semiconductor manufacturing apparatus includes a plurality of laser irradiation parts on the polishing head. At least one of the laser irradiation parts is a laser irradiation part configured to radiate a laser beam toward the back surface side of the polishing object.

15 Claims, 7 Drawing Sheets

(56) References Cited

FOREIGN PATENT DOCUMENTS

| | | | |
|---|---|---|---|
| JP | 2003057027 | A | 2/2003 |
| JP | 2006237445 | A | 9/2006 |
| JP | 2007059661 | A | 3/2007 |
| JP | 2021529097 | A | 10/2021 |
| TW | 202000368 | A | 1/2020 |
| TW | 202117829 | A | 5/2021 |
| WO | 0174537 | A1 | 10/2001 |

* cited by examiner

SEMICONDUCTOR MANUFACTURING APPARATUS AND METHOD OF MANUFACTURING SEMICONDUCTOR DEVICE

CROSS-REFERENCE TO RELATED APPLICATIONS

This application is based upon and claims the benefit of priority from Japanese Patent Application No. 2022-036600, filed Mar. 9, 2022, the entire contents of which are incorporated herein by reference.

BACKGROUND

Technical Field

Embodiments described herein relate generally to a semiconductor manufacturing apparatus and a method of manufacturing a semiconductor device.

Related Art

In a chemical mechanical polishing (CMP) apparatus, in order to promote a chemical reaction and control a polishing rate, a technique of heating a polishing surface and controlling a temperature has been put into practical use. So far, a method of installing a heat exchanger on a polishing pad and a mechanism of injecting a high temperature vapor onto a polishing pad have been put into practical use.

In the related art, a temperature distribution in a wafer surface, which is a polishing object, could not be controlled in detail. Therefore, there was a problem that in-plane uniformity of a polishing rate in a wafer surface is deteriorated. In addition, in a method in the related art, since the temperature is controlled by heat exchange, there was also a problem that the temperature could not be raised rapidly.

Further, in some apparatuses in the related art, polishing is performed while putting slurry onto a polishing table and pressing a wafer onto the polishing table with a polishing pad, but in the case of the apparatus in the related art, there was a problem that polishing characteristics changed significantly due to inhibition of slurry inflow and a decrease in slurry concentration.

DETAILED DESCRIPTION

In some embodiments, a semiconductor manufacturing apparatus is a semiconductor manufacturing apparatus for holding a polishing object on a polishing head and polishing a surface of the polishing object. The semiconductor manufacturing apparatus may include, but is not limited to, a plurality of laser irradiation parts on the polishing head. At least one of the laser irradiation parts is a laser irradiation part configured to radiate a laser beam toward a back surface of the polishing object.

Some embodiments will be described hereinafter with reference to the drawings.

In the following description, components having the same or similar functions are designated by the same reference signs. Further, overlapping description of these components may be omitted. "Neighboring" herein is not limited to a case in which elements are adjacent to each other and includes a case in which another element is present between the two elements that are objects. In this specification, "xx is provided on yy" is not limited to a case in which xx comes in contact with yy and also includes a case in which another member is interposed between xx and yy. In this specification, "parallel" and "perpendicular" include "substantially parallel" and "substantially parallel," respectively.

Further, first, an X direction, a Y direction, and a Z direction are defined. The X direction and the Y direction are directions along a flat upper surface of a disc-shaped table 1, which will be described below. The Y direction is a direction which intersects (for example, is orthogonal to) the X direction. The Z direction is a direction which intersects (for example, is orthogonal to) the X direction and the Y direction, and is a thickness direction of the disc-shaped table 1, which is equivalent to a vertical direction. In this specification, "a +Z direction" may be referred to as "upward" and "a −Z direction" may be referred to as "downward." The +Z direction and the −Z direction are 180° different from each other. However, these expressions are for convenience only and do not identify a direction of gravity.

First Embodiment

Hereinafter, a polishing apparatus of a first embodiment will be described with reference to the accompanying drawings.

Figure 1:
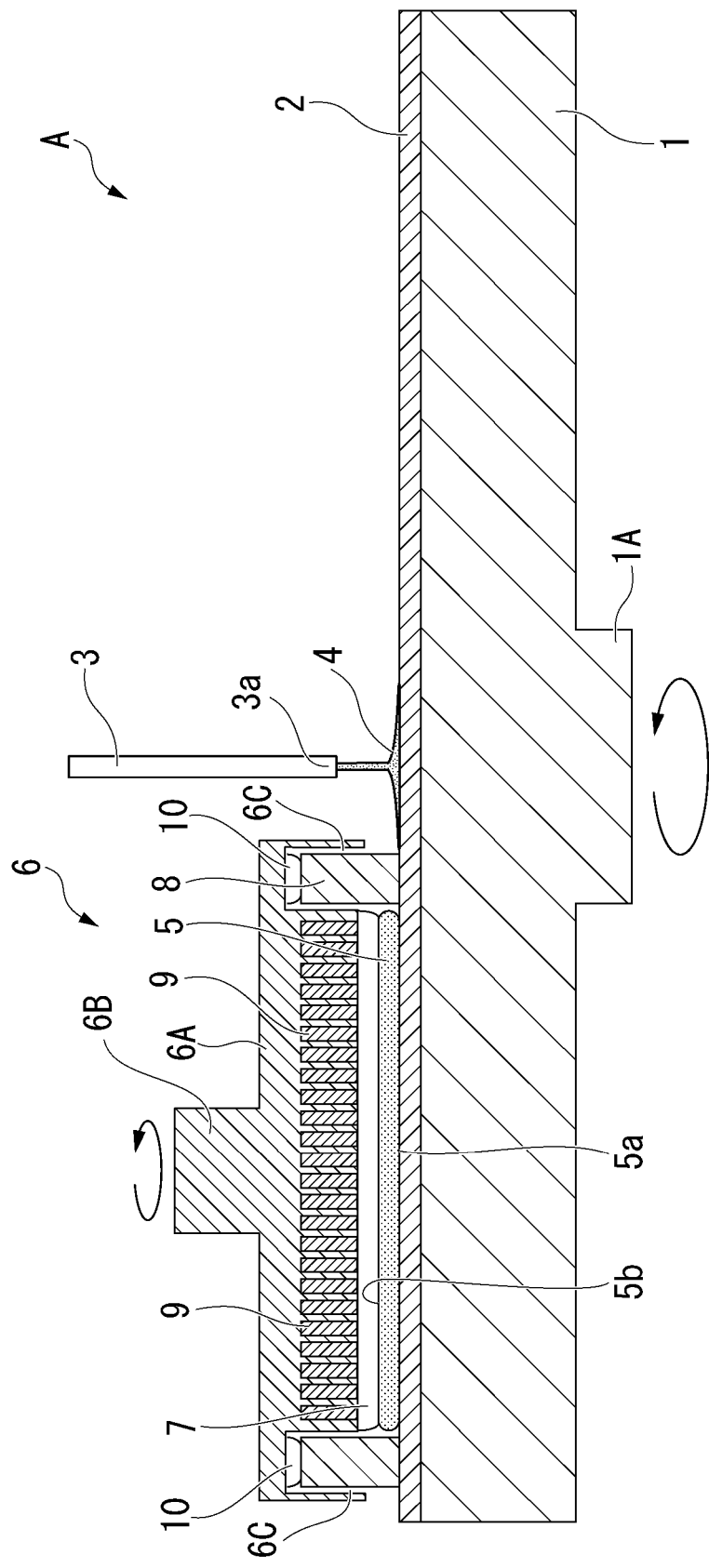
FIG. 1 is a cross-sectional diagram showing a first embodiment of a polishing apparatus.

FIG. 1 is a cross-sectional view of a semiconductor manufacturing apparatus (a polishing apparatus) A according to the first embodiment.

The semiconductor manufacturing apparatus A has the disc-shaped table 1 that is rotatable and disposed horizontally, and a polishing pad 2 installed on an upper surface of the table 1. A slurry nozzle 3 is provided above the polishing pad 2, and a required amount of slurry 4 can be supplied onto the polishing pad 2 from the slurry nozzle 3. The polishing pad 2 is formed in a circular sheet shape having substantially the same diameter as the upper surface of the table 1. The polishing pad 2 is constituted by a resin such as foamable polyurethane or the like. The polishing pad 2 is attached to the upper surface of the table 1 to be removable therefrom as an example.

A rotary shaft 1A extending in the Z direction is attached to a lower surface central section of the table 1, and the table 1 is rotatably supported along a horizontal surface about the rotary shaft 1A. While a driving apparatus including a motor or the like configured to rotate the rotary shaft 1A is provided below the rotary shaft 1A, the driving apparatus is omitted from FIG. 1, and only an upper end portion of the rotary shaft 1A is shown.

The slurry nozzle 3 has a tip portion 3a which is disposed vertically downward, and the tip portion 3a of the slurry nozzle 3 is disposed above a center of the table 1 at a predetermined interval. Since the table 1 and the polishing pad 2 are simultaneously rotated, the slurry 4 dropped onto a center of the upper surface of the polishing pad 2 from the slurry nozzle 3 can flow while gradually widening along the upper surface of the polishing pad 2 in the circumferential direction of the polishing pad 2 due to a centrifugal force. Further, the slurry nozzle 3 shown in FIG. 1 is one example, and an installation position, an orientation or a configuration of the slurry nozzle 3 may be arbitrary as long as the slurry nozzle 3 can supply the slurry 4 onto the upper surface of the polishing pad 2.

The slurry 4 is a liquefied medium having viscosity, in which a desired amount of particles of a polishing material used for polishing is dispersed in a solution such as a solvent.

In FIG. 1, a disc-shaped wafer (semiconductor substrate) 5, a disc-shaped bag 7 and a disc-shaped polishing head 6 are disposed between a position where the slurry nozzle 3 is disposed above the table 1 and an outer circumferential edge of the table 1 from below in sequence. In the example shown in FIG. 1, a diameter of the polishing head 6 is formed slightly smaller than a radius of the table 1, and a diameter of the wafer 5 and the bag 7 are formed slightly smaller than the diameter of the polishing head 6. The diameter of the wafer 5 and the diameter of the bag 7 are formed substantially equal to each other. In the example of FIG. 1, the polishing head 6, the wafer 5 and the bag 7 are installed on the side of the −X direction (the left side) of the center of the table 1.

The wafer 5 is installed substantially horizontally on the upper surface of the polishing pad 2 in a state in which a surface (a bottom surface) 5a thereof comes in contact with the upper surface of the polishing pad 2. The polishing head 6 is horizontally installed on a back surface (an upper surface) 5b of the wafer 5 via the disc-shaped bag 7. The polishing head 6 has a disc-shaped main body portion 6A, and a rotary shaft 6B extending in the Z direction is attached to a center thereof on the side of the upper surface.

The rotary shaft 6B is connected to a rotation driving mechanism including a motor or the like, illustration of which is omitted in FIG. 1. Since the rotation driving mechanism can rotate the rotary shaft 6B separately from rotation of the above-mentioned table 1, the table 1 and the polishing head 6 are individually rotated. In addition, the polishing head 6 and the rotary shaft 6B are supported by a support mechanism (not shown) to be movable in the Z direction and the XY directions in a space above the table 1, and the polishing head 6 can approach and move away from the upper surface of the polishing pad 2 to be positioned at an arbitrary position.

A plurality of laser irradiation parts 9 are incorporated in the main body portion 6A of the polishing head 6 from a lower surface central section to a lower surface outer circumferential portion of the main body portion 6A. A retainer ring 8 is attached to an outer side of a region in which the laser irradiation parts 9 is disposed, which is an outer circumferential edge portion of the main body portion 6A. The retainer ring 8 is constituted by a ring body having the same height as that of the polishing head 6.

An annular downward groove portion 6C is formed in a lower surface outer circumferential edge portion of the polishing head 6 and the retainer ring 8 is provided along the groove portion 6C. An upper side of the retainer ring 8 is accommodated inside the groove portion 6C. A lower side of the retainer ring 8 is attached to protrude downward from a lower surface opening portion of the groove portion 6C by a predetermined length. An annular elastic member 10 is inserted between an upper section of the retainer ring 8 and an inner bottom side of the groove portion 6C. A lower end portion of the retainer ring 8 protrudes downward from a lower surface of the polishing head 6 by a predetermined length, and the wafer 5 and the bag 7 are disposed inside the retainer ring 8 protruding below the polishing head 6.

A lower end inner circumferential side of the retainer ring 8 is disposed to surround outer circumferential sides of the wafer 5 and the bag 7 with a slight gap. As described below, when the wafer 5 is polished, the retainer ring 8 suppresses the wafer 5 and the bag 7 from jumping out.

Figure 3:
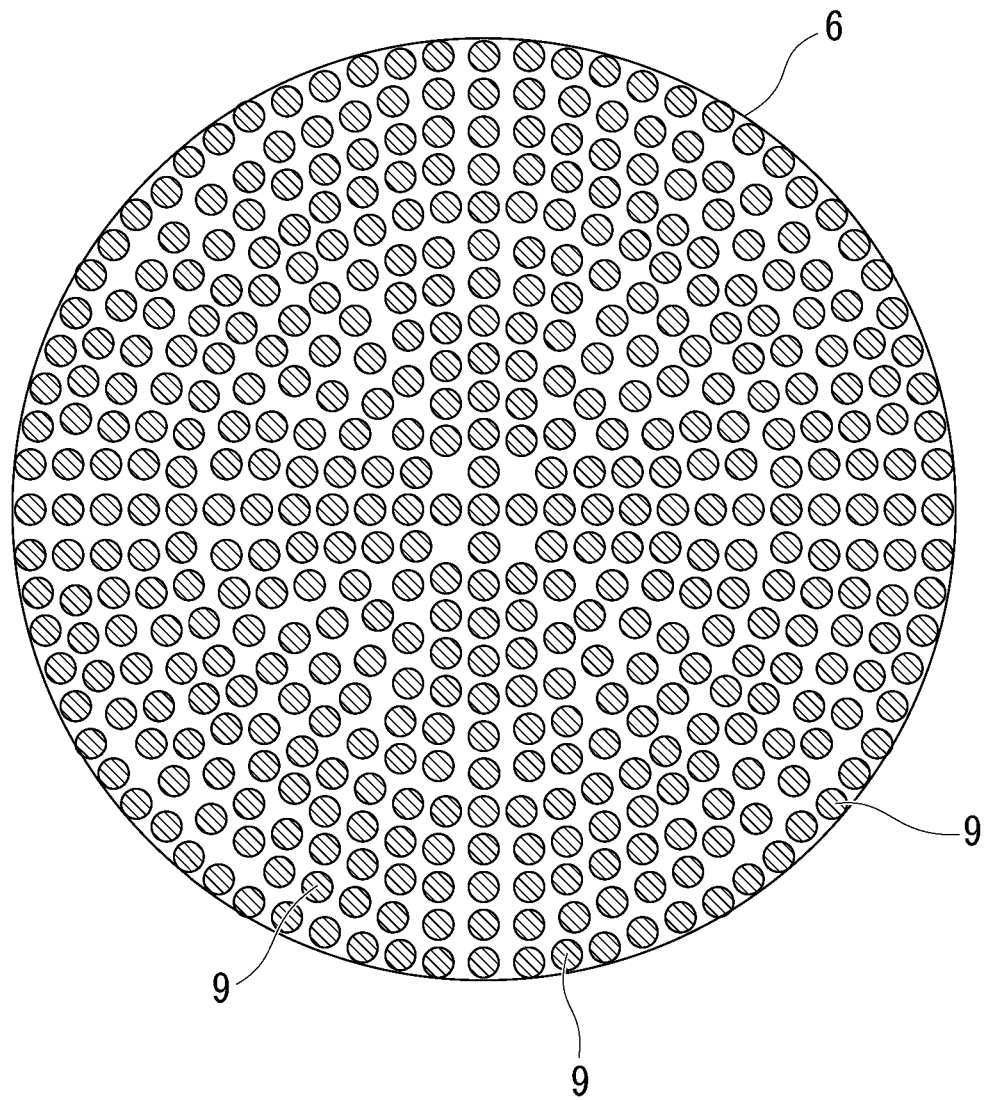
FIG. 3 is a bottom view showing a laser irradiation part of the polishing apparatus shown in FIG. 1.

The laser irradiation parts 9 incorporated in the polishing head 6 are abbreviated as cylindrical shape in a cross section shown in FIG. 1. As shown in FIG. 3 when the bottom surface of the polishing head 6 is seen in a plan view, the plurality of laser irradiation parts 9 are disposed to adjacent to each other at a predetermined interval from a bottom surface central section toward an outer circumferential edge portion of the polishing head 6. Each of the laser irradiation parts 9 is disposed to pass through the lower side of the main body portion 6A in the Z direction, and tip surfaces of the laser irradiation parts 9 are exposed to a bottom surface of the main body portion 6A.

In the example shown in FIG. 3, in the bottom surface of the polishing head 6, the plurality of laser irradiation parts 9 are densely disposed such that an interval between the laser irradiation parts 9 and 9 that approach each other most closely in the radial direction and the circumferential direction of the bottom surface is smaller than a diameter of each of the laser irradiation parts 9. Further, disposition of the plurality of laser irradiation parts 9 is not limited to the example shown in FIG. 3, and any disposition state may be selected as long as the laser irradiation parts 9 can be disposed to be adjacent to each other. All tip surfaces of the laser irradiation parts 9 are disposed to be substantially flush with a bottom surface 6D of the polishing head 6.

Figure 2:
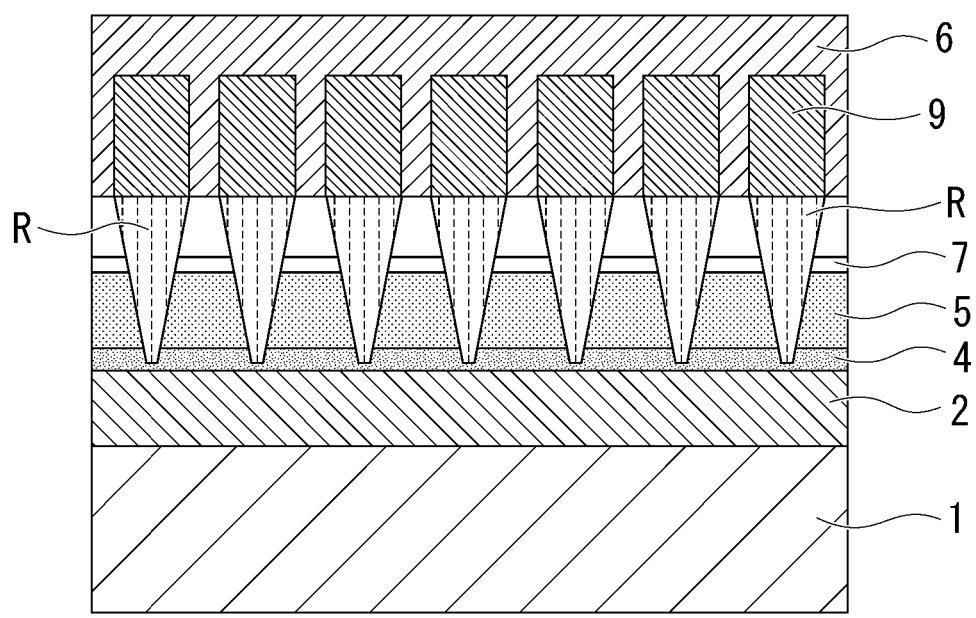
FIG. 2 is a partially enlarged cross-sectional diagram of the polishing apparatus shown in FIG. 1.

Further, each of the laser irradiation parts 9 shown in FIG. 1 to FIG. 3 is connected to a laser light source (IR light source) such as infrared light or the like omitted in the drawings via a transmission path such as an optical fiber or the like. The laser beam (infrared light) transmitted from the laser light source (not shown) via the transmission path can be emitted from the tip of each of the laser irradiation parts 9. Further, while not shown, a condensing optical system such as a condensing lens or the like is incorporated on the side of the tip portions of the laser irradiation parts 9, and the laser beam focused as exemplified in FIG. 2 can be emitted from the tips of the laser irradiation parts 9 toward the front of the laser irradiation parts 9.

Since FIG. 2 shows a state in which the tips of the laser irradiation parts 9 are disposed downward, FIG. 2 is drawn so that the laser beam irradiated downward is gradually narrowed and an optical path width of the laser beam is gradually narrowed. In addition, in a state in which the polishing head 6 is installed as shown in FIG. 1 and FIG. 2, an aperture of the laser beam is set such that a focus position of the laser beam substantially matches the slurry 4 or the polishing pad 2.

Further, a wavelength of the laser beam irradiated from the laser irradiation parts 9 is preferably within a range of 2.5 μm or more and 3.5 μm or less, within a range of 5.5 μm or more and 6.5 μm or less, or a wavelength of 10 μm or more. As a laser element that can emit a laser beam having these wavelengths, an yttrium aluminum garnet (YAG) laser, an yttrium scandium gallium garnet (YSGG) laser, a fluoride glass (ZBLAN) laser, an yttrium lithium fluoride (YLF) laser, a $CO_2$ laser, or the like, is exemplified.

The bag 7 is a bag body constituted by a membrane such as a silicon rubber through which infrared light (IR light) transmits, for example, a silicon rubber or the like that does not contain silica particles. A fluid pressurizing means (air pressurizing means), which is not shown, is connected to the bag 7, a fluid such as air or the like is injected into the bag 7, and thus, a thickness of the bag 7 can be adjusted. A membrane such as a silicon rubber or the like that does not contain silica particles is preferable because transmissivity of 90% or more with respect to a wide wavelength of the light of the infrared region is provided.

For this reason, by adjusting the thickness (expansion amount) of the bag 7, the upper surface of the bag 7 can be pressed against the bottom surface 6D of the polishing head 6 and the lower surface of the bag 7 can be pressed against the upper surface of the wafer 5. Accordingly, the lower surface of the wafer 5 can be pressed against the upper surface of the polishing pad 2 with a predetermined pressure. That is, by adjusting an amount of a fluid supplied to the bag 7, it is possible to adjust a pressure when the bag 7 presses the surface 5a of the wafer 5 against the polishing pad 2.

Further, a force of pressing the wafer 5 against the polishing pad 2 by the bag 7 does not have to be constant at all times, and may be changed as appropriate, such as by changing as the polishing progresses.

Further, it may be a structure that divides the inside of the bag 7 into a plurality of regions. A hydraulic pressure can be adjusted for each of the regions divided by being partitioned into the plurality of regions, and a pressing force with respect to the wafer 5 for each of the regions can be adjusted. Accordingly, for example, in the case in which the lower surface of the wafer 5 is pressed against the upper surface of the polishing pad 2, when the lower surface of the wafer 5 is inclined with respect to the upper surface of the polishing pad 2, the hydraulic pressure for each of the plurality of regions can be adjusted to correct the inclination, and thus, the above-mentioned inclination can be corrected.

The wafer 5 is constituted by a semiconductor substrate such as an infrared light (IR light)-transmissive silicon substrate or the like. Accordingly, a wavelength of the above-mentioned laser beam R is a transmission wavelength of the semiconductor substrate, which is an infrared light region.

When the bag 7 and the wafer 5 are formed of the above-mentioned materials, if the laser beam having the above-mentioned wavelength is used as the laser beam, the laser beam radiated toward the back surface 5b of the wafer 5 can pass through the bag 7 and the wafer 5 and reliably arrive at the slurry 4 or the polishing pad 2. Accordingly, the laser beam can heat the slurry 4 or the polishing pad 2.

In order to perform the polishing of the wafer 5 using the semiconductor manufacturing apparatus A, rotation of the table 1 is stopped, the wafer 5 and the bag 7 are disposed on the upper surface of the polishing pad 2 in a stack like a state shown in FIG. 1, and the retainer ring 8 is aligned to surround them. The polishing head 6 located above the wafer 5 and the bag 7 is lowered to surround the wafer 5 and the bag 7 on a lower side of the retainer ring 8, and a predetermined hydraulic pressure is applied to the bag 7 to press the lower surface of the wafer 5 against the upper surface of the polishing pad 2 using the bag 7. The slurry for polishing is supplied to the upper surface of the polishing pad 2 from the slurry nozzle 3, and the polishing head 6 is also rotated while rotating the table 1.

According to the above-mentioned manipulation, while the slurry 4 is supplied between the wafer 5 and the polishing pad 2, the wafer 5 and the polishing pad 2 can be relatively slid to each other in a state in which the wafer 5 is held by the polishing head 6 while pressing the surface 5a of the wafer 5 against the upper surface of the polishing pad 2. Since the polishing material is contained in the slurry 4, the surface of the wafer 5 can be polished.

In addition, the laser beam is introduced into each of the laser irradiation parts 9 from the laser light source (not shown) via the transmission path, and the laser beam R is radiated to the wafer 5 that is the polishing object as shown in FIG. 2 from the tip sides of the laser irradiation parts 9. The laser beam R passes through the bag 7 and the wafer 5, and the focused region of the laser beam R radiates to the slurry 4 and the upper surface of the polishing pad 2.

Since the infrared light (IR light) is used as the laser beam R, the slurry 4 and the polishing pad 2 can be mainly heated and the temperature of the polishing surface of the wafer 5 can be adjusted to a target polishing temperature without heating the bag 7 and the wafer 5. For example, the polishing surface of the wafer 5 and the slurry 4 adjacent to the polishing surface can be heated to a target temperature of 40° C. to 70° C.

By heating the polishing surface of the wafer 5 to a target temperature, it is possible to promote a chemical reaction between the slurry 4 and the polishing surface of the wafer 5 during polishing and increase a polishing rate.

In addition, when the laser irradiation parts 9 during polishing is relatively moved in a rotation direction with respect to the wafer 5 that is a polishing object, the region irradiated with the laser beam R can be relatively moved with respect to the wafer 5, and occurrence of a local temperature difference can be prevented.

Figure 4:
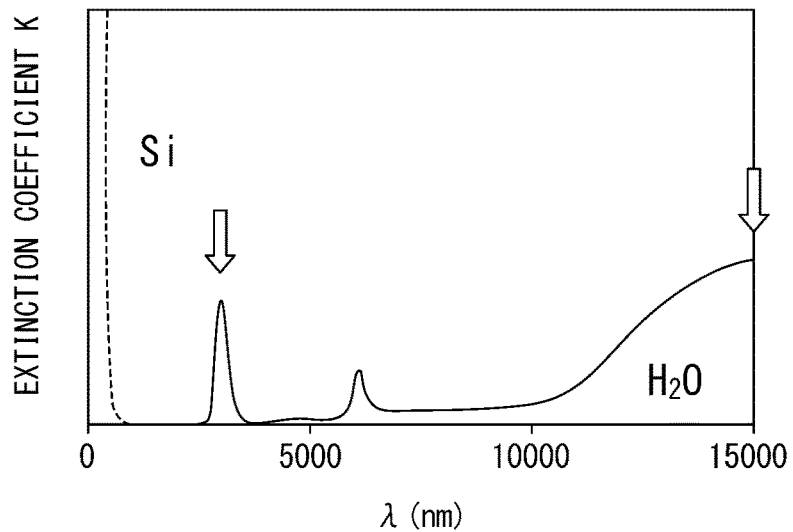
FIG. 4 is a graph showing an example of frequency dependence related to an extinction coefficient of silicon and water.

FIG. 4 is a view showing frequency dependence related to an extinction coefficient K of silicon (Si) and water ($H_2O$). As shown in FIG. 4, the silicon shows high transparency in the infrared region (IR region), while the water has an absorption wavelength for light in the vicinity of a wavelength of 3 μm (3000 nm) and a wavelength of 6 μm (6000 nm). In addition, the water has a gradual increase in absorption rate for light with a wavelength exceeding 10 μm (10000 nm) and exhibits a relatively high absorption wavelength at a wavelength of 15 μm (15000 nm).

Accordingly, as described above, the laser beams emitted from the laser irradiation parts 9 are within a range of 2.5 μm or more and 3.5 μm or less, or within a range of 5.5 μm or more and 6.5 μm or less, and alternatively, a laser beam (IR light) with a wavelength of 10 μm or more is set preferably.

Figure 5:
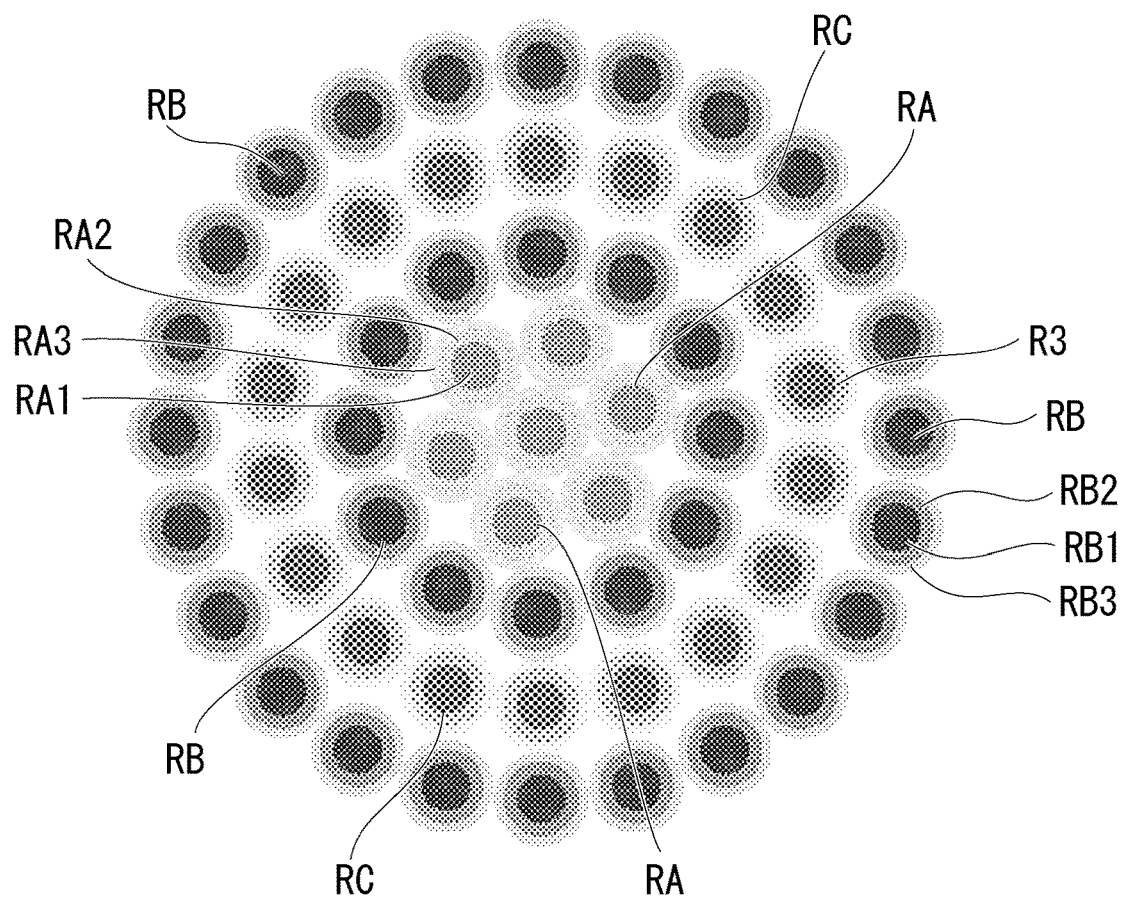
FIG. 5 is a conceptual view showing an example of a state in which a wafer is heated by laser irradiation.

FIG. 5 is a schematic diagram for describing a temperature distribution when the laser beam is radiated to the slurry 4 or the polishing pad 2 from the plurality of laser irradiation parts 9 and the surface 5a of the wafer 5 is heated as shown in FIG. 2.

In FIG. 5, for example, the power of the laser beam RA radiated to the central section in the surface 5a of the wafer 5 is set the lowest value, and the power of the laser beam RB radiated to the outer side of the central section and the outermost circumference is set as the maximum value. Further, the power of the laser beam RC radiated to the region between the outer side of the central section and the outermost circumference is set to about an intermediate value. As described above, since the laser power can be used properly, all the laser irradiation parts 9 can control the power individually. By setting the laser power as described above, the laser power can be adjusted such that uniform heating with high in-plane uniformity can be performed in the surface (polishing surface) 5*a*.

In addition, a central region on which the laser beams from the laser irradiation parts 9 are focused in a spot is a region heated to the highest temperature, and quasi-heating regions in which heating temperatures are sequentially decreased around the high temperature heating region are sequentially generated in concentric circular shapes. For example, in FIG. 5, in a region RA heated by the laser beam radiated to the central section, a central section RA1 thereof is a region heated to the highest temperature, RA2 is a second highest temperature region, and RA3 is a third highest temperature region. In addition, in a region RB heated by the laser beams radiated to the outermost circumference, a central section RB1 thereof is a region heated to the highest temperature, RB2 is a second highest temperature region, and RB3 is a third highest temperature region.

Further, in FIG. 5, although not specifically described outside the third highest temperature regions RA3 and RB3, these outer regions are also heated as regions having temperatures slightly lower than the third highest temperature regions RA3 and RB3.

Since the plurality of laser irradiation parts 9 are disposed densely as shown in FIG. 3, by overlapping the quasi-heating regions due to the adjacent laser irradiation parts 9 or bringing them close to each other, uniform heating with high in-plane uniformity can be performed in the surface (polishing surface) 5*a* of the wafer 5.

Further, a mechanism configured to swing the polishing head 6 with respect to the wafer 5 for the purpose of further increasing the heating temperature uniformity of the wafer surface may be separately provided such that the polishing head 6 can relatively swing with respect to the wafer 5.

According to the semiconductor manufacturing apparatus A of the first embodiment, the surface (polishing surface) 5*a* of the wafer 5 can be rapidly heated without contributing to an inflow or a concentration of the slurry. In addition, by individually controlling the power or the irradiation time of each of the laser irradiation parts 9, in-plane temperature distribution control of the wafer 5 during polishing can be performed. In addition, by relatively swinging the laser irradiation parts 9 with respect to the wafer 5 that is a polishing object, occurrence of a local temperature difference can be prevented. As a result, it is possible to improve the in-plane uniformity of the polishing characteristics such as homogenization of the polishing rate and elimination of the step difference after polishing.

Since power control of each of the laser irradiation parts 9 is possible and the irradiation time can also be controlled, a local in-plane temperature in the surface of the wafer 5 can be controlled, and temperature responsiveness during heating can also be improved.

Further, in the structure of the embodiment, a moving mechanism (not shown) configured to relatively move with respect to the wafer 5 that is a polishing object in a rotation direction is installed to rotate the polishing head 6. However, the moving mechanism is omitted, the moving direction is not limited to the rotation direction, and a configuration of polishing the surface (polishing surface) 5*a* of the wafer 5 through relative sliding of the polishing pad 2 and the wafer 5 may be employed.

Second Embodiment

Figure 6:
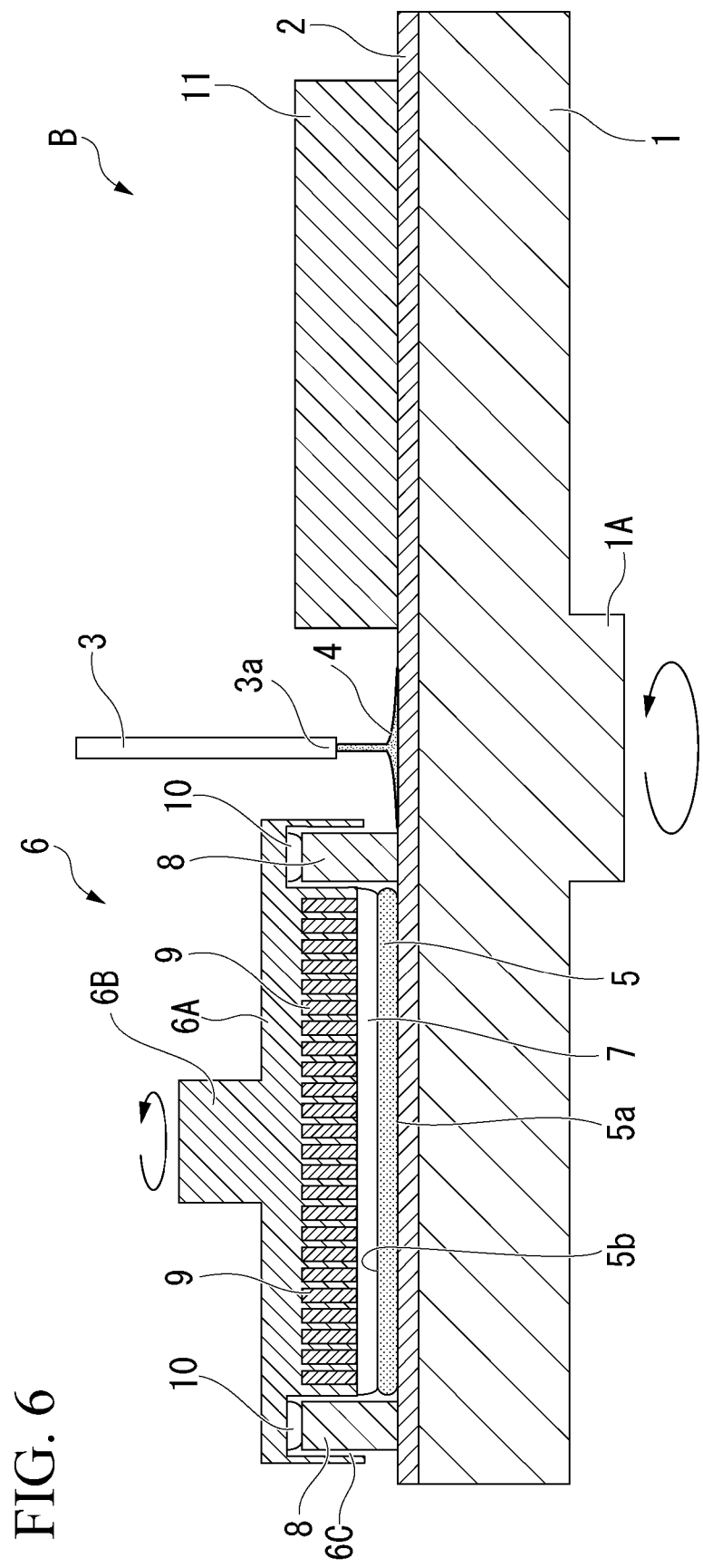
FIG. 6 is a configuration view showing a second embodiment of a polishing apparatus.

FIG. 6 shows a semiconductor manufacturing apparatus (a polishing apparatus) B according to a second embodiment. The semiconductor manufacturing apparatus B of the second embodiment is characterized in that a cooling mechanism 11 is provided on the polishing pad 2, in addition to the same configuration as that of the semiconductor manufacturing apparatus A of the first embodiment.

The semiconductor manufacturing apparatus B has the table 1, the polishing pad 2, the slurry nozzle 3, the slurry 4, the polishing head 6, the bag 7, the retainer ring 8, and the laser irradiation parts 9, and further has the cooling mechanism 11.

The cooling mechanism 11 is constituted by a 3-dimensional tank that can accommodate a cooling liquid such as water or the like, and can employ a mechanism that cools the polishing pad 2 by removing heat from the polishing pad 2 in contact with the liquid surface of the slurry 4, or in contact with or close to the upper surface of the polishing pad 2. It is possible to employ a cooling slider or the like configured to come into contact with the slurry 4 or the polishing pad 2 as the cooling mechanism 11. It is desirable to connect a pipeline configured to circulate a cooling liquid to the cooling mechanism 11 so that the cooling liquid is circulated.

The semiconductor manufacturing apparatus B of the second embodiment can obtain the same effects as the semiconductor manufacturing apparatus A of the abovementioned first embodiment, and the slurry 4 or the polishing pad 2 can be directly cooled by providing the cooling mechanism 11. Since the slurry 4 and the polishing pad 2 cooled by the cooling mechanism 11 are rotated to come in contact with wafer 5 eventually, the wafer 5 can be indirectly cooled by the cooling mechanism 11 via the slurry 4 or the polishing pad 2.

Since the semiconductor manufacturing apparatus B of the second embodiment can heat the wafer 5 using the plurality of laser irradiation parts 9 and cool the wafer 5 using the cooling mechanism 11, it becomes a structure in which a heating means of the wafer 5 and a cooling means of the wafer 5 are separately provided. By employing a hot/cool separation structure in which the heating means and the cooling means of the wafer 5 are separately provided in this way, thermal responsiveness when the wafer 5 is polished can be improved. In addition, when thermal responsiveness of the heating and the cooling of the wafer 5 is improved, reactivity of the slurry 4 when the wafer 5 is polished can be controlled in detail, and the in-plane uniformity of the polishing characteristics such as homogenization of the polishing rate and elimination of the step difference after polishing can be improved.

Third Embodiment

Figure 7:
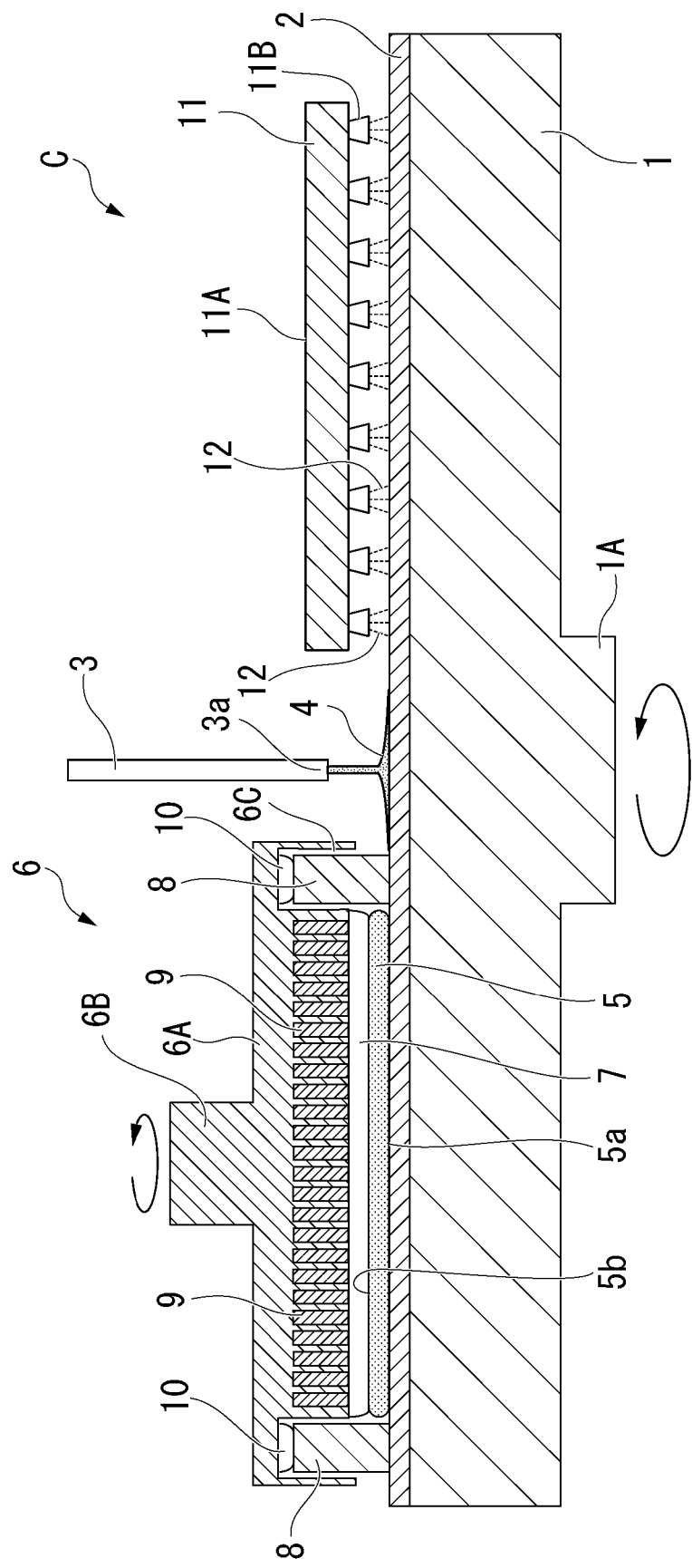
FIG. 7 is a configuration view showing a third embodiment of the polishing apparatus.

FIG. 7 shows a semiconductor manufacturing apparatus (a polishing apparatus) C according to a third embodiment. The semiconductor manufacturing apparatus C of the third embodiment is characterized in that the cooling mechanism 11 is provided on the polishing pad 2, in addition to the same configuration as the semiconductor manufacturing apparatus A of the first embodiment.

The semiconductor manufacturing apparatus C has the table 1, the polishing pad 2, the slurry nozzle 3, the slurry 4, the polishing head 6, the bag 7, the retainer ring 8, and the laser irradiation parts 9, and further has the cooling mechanism 11.

The cooling mechanism 11 has a 3-dimensional tank 11A that can accommodate a cooling liquid such as water or the like, and a plurality of injection nozzles 11B formed on a lower surface of the tank 11A. The cooling mechanism 11 can employ a mechanism configured to supply a cooling liquid 12 such as water or the like to the upper surface of the polishing pad 2 from the plurality of injection nozzles 11B to remove heat from the polishing pad 2 and cool the polishing pad 2. It is desirable to connect a pipeline configured to supply a cooling liquid to the cooling mechanism 11 so that the cooling liquid can be supplied.

The semiconductor manufacturing apparatus C of the third embodiment can obtain the same effects as the semiconductor manufacturing apparatus A of the above-mentioned first embodiment, and the slurry 4 or the polishing pad 2 can be directly cooled by providing the cooling mechanism 11 having the injection nozzles 11B. Since the slurry 4 and the polishing pad 2 cooled by the cooling mechanism 11 are rotated to come into contact with wafer 5 eventually, the wafer 5 can be indirectly cooled by the cooling mechanism 11 via the slurry 4 or the polishing pad 2.

Since the semiconductor manufacturing apparatus C of the third embodiment can heat the wafer 5 using the plurality of laser irradiation parts 9 and cool the wafer 5 using the cooling mechanism 11, it becomes a structure in which the heating means of the wafer 5 and the cooling means of the wafer 5 are separately provided. By employing a hot/cool separation structure in which the heating means and the cooling means of the wafer 5 are separately provided in this way, thermal responsiveness when the wafer 5 is polished can be improved. In addition, when the thermal responsiveness of the heating and the cooling of the wafer 5 is improved, it is possible to control reactivity of the slurry 4 in detail when the wafer 5 is polished and improve the in-plane uniformity of the polishing characteristics such as homogenization of the polishing rate or elimination of the step difference after polishing.

Figure 8:
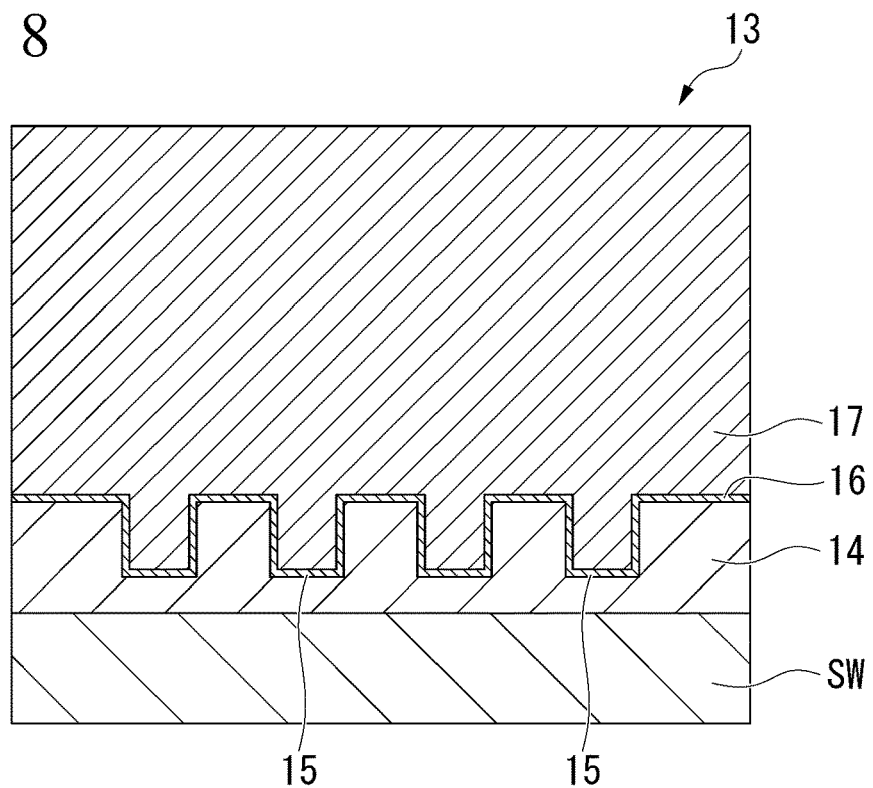
FIG. 8 is a cross-sectional diagram showing an example of a polishing object before polishing.

Structure of Polishing Object:

FIG. 8 shows a schematic cross section of a polishing object 13 that is a polishing object according to the semiconductor manufacturing apparatuses (polishing apparatuses) A, B and C of the above-mentioned first to third embodiments.

An insulating film 14 constituted by a silicon oxide film is formed to a thickness of, for example, 150 nm on a semiconductor substrate SW such as a silicon wafer or the like on which elements (not shown) are formed, and a plurality of interconnection grooves 15 each having a rectangular cross-sectional shape are formed in the insulating film 14 to a depth of 100 nm.

A barrier film 16 formed of tantalum (Ta) is formed to a thickness of 10 nm to partially bury the interconnection grooves 15 and cover the insulating film 14 around the interconnection grooves 15. In addition, an interconnection metal film 17 formed of copper (Cu) is formed to a thickness of 500 nm to bury the interconnection grooves 15 and cover the side of an upper surface of the barrier film 16.

Further, the polishing object 13 shown in FIG. 8 has a thin disc shape as a whole in actuality, and can be placed on the upper surface of the polishing pad 2 like the wafer 5 shown in FIG. 1. When the polishing is performed using the semiconductor manufacturing apparatus A shown in FIG. 1, the polishing surface can be installed to come into contact with the upper surface of the polishing pad 2 using the upper surface side of the interconnection metal film 17 shown in FIG. 8 as the polishing surface of the polishing object 13.

First Method of Manufacturing Semiconductor Device:

The laser beam R is radiated from the laser irradiation parts 9 to the polishing object 13 shown in FIG. 8 such that the temperature of the polishing surface becomes 65° C. from immediately after the beginning of the polishing using, for example, the semiconductor manufacturing apparatus (polishing apparatus) A shown in FIG. 1. The power of the laser beam R is adjusted while detecting the temperature of the polishing surface using an infrared light monitor (not shown) or the like. Here, it is preferable to decrease the power of the laser beam R, which radiates a central portion of the wafer where the temperature tends to rise, to be lower than the outer circumferential portion such that the temperature in the wafer surface is uniformized.

Then, the polishing is performed while adjusting the power of the laser beam R such that the polishing surface is maintained at a temperature of 65° C. until the thickness of the interconnection metal film 17 becomes 100 mu.

Since heat is generated due to friction between the wafer 5 and the polishing pad 2, the power of the laser beam R is gradually decreased in order to maintain the temperature of the polishing surface at 65° C. During irradiation of the laser beam R, occurrence of a local temperature difference can be prevented by relatively moving the laser irradiation parts 9 with respect to the polishing object 13 in the rotation direction.

Figure 9:
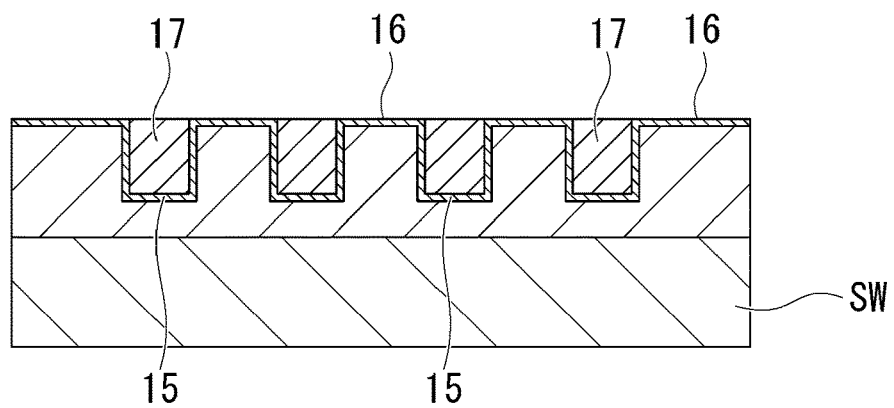
FIG. 9 is a cross-sectional diagram showing an example of the polishing object in the middle of the polishing.

Then, when an eddy current monitor (not shown) or the like detects that the thickness of the interconnection metal film 17 becomes 100 nm, radiation of the laser beam R is stopped and the polishing is continuously performed until the interconnection metal film 17 on the barrier film 16 is removed (see FIG. 9). The reason for stopping irradiation of the laser beam R is to prevent dishing in which the interconnection metal film 17 in the interconnection grooves 15 is recessed and erosion in which dense interconnection regions are recessed.

Then, the barrier film 16, the interconnection metal film 17, and the insulating film 14 are partially removed through polishing using another semiconductor manufacturing apparatus (polishing apparatus), which is not shown, having the same configuration as in FIG. 1. The polishing can be performed until an interconnection height becomes 50 nm, interconnections between the neighboring interconnection grooves can be electrically separated from each other, and a semiconductor device 20 including an interconnection structure 18 can be formed (see FIG. 10).

In the above-mentioned method of manufacturing the semiconductor device 20, rapid heating of the polishing surface can be performed by the laser irradiation parts 9 without exerting an influence to the inflow or the concentration of the slurry with respect to the polishing surface of the polishing object 13. In addition, by individually controlling the power or the irradiation time of each of the laser irradiation parts 9, temperature distribution control in the polishing surface during polishing can be performed. Further, occurrence of a local temperature difference can be prevented by relatively moving the laser irradiation parts 9 with respect to the polishing object 13 (or the wafer 5).

As a result, it is possible to improve the in-plane uniformity of the polishing characteristics such as uniformity of the polishing rate or elimination of the step difference after polishing, prevent occurrence of residue of the interconnection metal film 17 on the barrier film 16, and prevent occurrence of dishing and erosion due to partial excessive polishing in the surface.

Second Method of Manufacturing Semiconductor Device:

The polishing object in the second manufacturing method is the same as the polishing object 13 used in the first manufacturing method. In the embodiment, the laser beam R is radiated from the laser irradiation parts 9 such that the polishing surface temperature becomes 65° C. immediately after the beginning of the polishing using the semiconductor manufacturing apparatus (polishing apparatus) B according to the second embodiment shown in FIG. 6. At the same time, the slurry 4 and the polishing pad 2 are cooled downstream the polishing surface using the cooling mechanism 11.

Then, the polishing is performed to maintain the temperature of the polishing surface at 65° C. until the thickness of the interconnection metal film 17 becomes 100 nm. Next, when it is detected that the thickness of the interconnection metal film 17 becomes 100 nm, irradiation of the laser beam R is stopped, and the polishing is performed until the interconnection metal film 17 on the barrier film 16 is removed while cooling the polishing surface temperature to 40° C. using the cooling mechanism 11.

Figure 10:
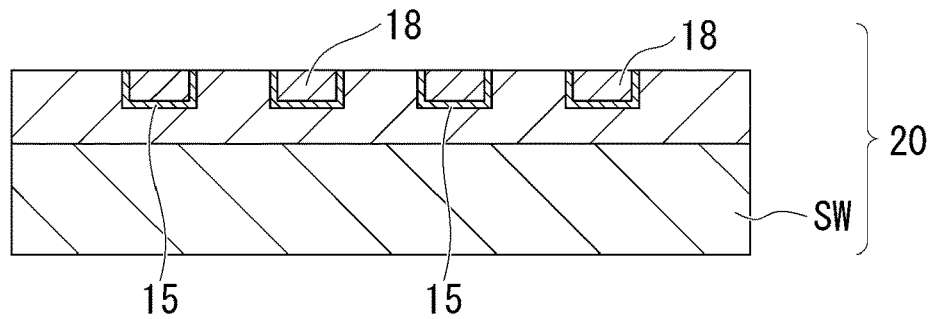
FIG. 10 is a cross-sectional diagram showing an example of the polishing object after the polishing.

Then, the barrier film 16, the interconnection metal film 17, and the insulating film 14 shown in FIG. 9 are partially removed using another semiconductor manufacturing apparatus (polishing apparatus), which is not shown, having the same configuration as FIG. 2, the interconnection structure 18 shown in FIG. 10 is formed, and the semiconductor device 20 is formed.

In the above-mentioned method of manufacturing the semiconductor device 20, non-uniformity of the temperature distribution on the polishing pad 2 due to the heat generated by the friction or the chemical reaction during polishing can be solved. Further, the temperature distribution control in the polishing surface can be homogenized more than in the above-mentioned first manufacturing method. In addition, it is possible to prevent occurrence of the residue of the interconnection metal film 17 on the barrier film 16 and occurrence of dishing and erosion due to partial excessive polishing in the surface more than in the first manufacturing method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing apparatus comprising:
    a polishing head configured to hold a polishing object having a first surface and a second surface, the first surface being a surface to be polished, the second surface being opposite to the first surface, the polishing head having a lower surface facing the second surface, the lower surface having a central portion and an outer circumferential portion, and the polishing head having a plurality of laser irradiation units incorporated in the polishing head in a region from the central portion to the outer circumferential portion,
    wherein at least one of the plurality of laser irradiation units is configured to irradiate a laser beam to the second surface of the polishing object.

2. The semiconductor manufacturing apparatus according to claim 1, wherein:
    the polishing object is a semiconductor substrate, and
    the at least one of the plurality of laser irradiation units is configured to irradiate a laser beam having a wavelength which is the same as a transmission wavelength of the polishing object.

3. The semiconductor manufacturing apparatus according to claim 1, wherein the at least one of the plurality of laser irradiation units is configured to irradiate a laser beam having a wavelength which is in an infrared wavelength range.

4. The semiconductor manufacturing apparatus according to claim 1, wherein the at least one of the plurality of laser irradiation units is configured to irradiate a laser beam which is at least one of light with a wavelength of 2.5 µm or more and 3.5 µm or less, light with a wavelength of 5.5 µm or more and 6.5 µm or less, and light with a wavelength of 10 µm or more.

5. The semiconductor manufacturing apparatus according to claim 1, wherein the at least one of the plurality of laser irradiation units comprises one of a YAG laser, a YSGG laser, a ZBLAN laser, a YLF laser, and a CO2 laser.

6. The semiconductor manufacturing apparatus according to claim 1, wherein each of the at least one of the plurality of laser irradiation units is independently controllable with respect to an emission power thereof.

7. The semiconductor manufacturing apparatus according to claim 1, further comprising:
    a polishing pad configured to polish the first surface of the polishing object; and
    a cooling mechanism configured to cool the polishing pad.

8. The semiconductor manufacturing apparatus according to claim 1, further comprising:
    a bag of a membrane through which the laser beam transmits, the bag being provided in the polishing head, wherein the bag is inflatable with an injection of fluid into the bag to pressurize the polishing object.

9. The semiconductor manufacturing apparatus according to claim 8, wherein the membrane comprises a silica-particle-free silicone rubber.

10. The semiconductor manufacturing apparatus according to claim 1, further comprising:
    a moving mechanism configured to move the plurality of laser irradiation devices relative to the polishing object.

11. A method of manufacturing a semiconductor device using the semiconductor manufacturing apparatus according to claim 1, the method comprising:
    polishing the first surface of the polishing object being held by the polishing head, while causing the at least one of the plurality of laser irradiation units to irradiate the laser beam to the second surface of the polishing object.

12. The method according to claim 11, wherein:
    the polishing object is a semiconductor substrate, and
    a wavelength of the laser beam is in a transmission wavelength of the polishing object.

13. The method according to claim 11, wherein a power of the laser beam is changed during the polishing.

14. The method according to claim 11, further comprising:
    causing a cooling device to cool a polishing pad polishing the first surface of the polishing object while the at least one of the plurality of laser irradiation units irradiates the laser beam to the second surface of the polishing object.

15. The method according to claim 11, further comprising:
  causing a moving mechanism to move the at least one of the plurality of laser irradiation units relative to the polishing object while the polishing head is polishing the first surface of the polishing object.

\* \* \* \* \*